United States Patent [19]

Horne

[11] 4,294,602
[45] Oct. 13, 1981

[54] ELECTRO-OPTICALLY ASSISTED BONDING

[75] Inventor: William E. Horne, Bellevue, Wash.
[73] Assignee: The Boeing Company, Seattle, Wash.
[21] Appl. No.: 64,994
[22] Filed: Aug. 9, 1979
[51] Int. Cl.³ .............................................. C03C 27/00
[52] U.S. Cl. ...................................... 65/40; 65/59 R; 65/59 B; 65/DIG. 4; 204/192 P
[58] Field of Search ........ 65/40, 59 R, 59 B, DIG. 4; 204/192 P

[56] References Cited

U.S. PATENT DOCUMENTS

| | | | |
|---|---|---|---|
| 3,397,278 | 8/1968 | Pomerantz | 65/40 X |
| 3,417,459 | 12/1968 | Pomerantz et al. | 29/472.9 |
| 3,452,178 | 6/1969 | Kleen | 65/DIG. 4 |
| 3,981,230 | 9/1976 | Lee | 93/33 H |

OTHER PUBLICATIONS

"Field Assisted Glass–Metal Sealing", *Journal of Applied Physics*, vol. 40, No. 10, 9/69, pp. 3946–3949, G. Wallis & D. Pomerantz.

"Integrally Bonded Covers for Silicon Solar Cells", Proceeding of the 11th IEEE Photovoltaic Specialists Conf., 1975, pp. 169–170, A. Kirkpatrick.

Primary Examiner—Arthur D. Kellogg
Attorney, Agent, or Firm—David L. Garrison; Robert L. Gullette

[57] ABSTRACT

A method of bonding a cover glass to a semiconductor substrate having conductors thereon. The cover glass and the semiconductor substrate are placed in a relatively high voltage field and heated to induce ion drift in the glass and improved conductivity in the substrate. Additional localized heating softens the cover glass in the vicinity of the conductors permitting the cover glass to flow around the conductors and to be drawn into contact and bonded with the substrate.

12 Claims, 4 Drawing Figures

ELECTRO-OPTICALLY ASSISTED BONDING

BACKGROUND OF THE INVENTION

1. Field of the Invention

This invention relates generally to electrostatic bonding of a cover glass to semiconductor cells. In particular, this invention relates to electrostatic bonding techniques which are combined with localized heating to provide bonding of cover glasses to semiconductor cells having metallic conductors placed on the surfaces thereof.

2. Description of the Prior Art

Cover glasses have been bonded to the surface of silicon solar cells in a variety of ways, including electrostatically induced bonding. Recent improvements in silicon solar cells have produced very thin, fragile plates of silicon material which are not readily adaptable to being sealed by the electrostatic bonding techniques of the prior art.

A typical silicon solar cell is about twelve mils thick and two centimeters square. The twelve mil thick substrate of a given material is appropriately doped to produce a pn junction. Photons create hole-electron pairs in the pn junction region and the resultant field causes current flow in the cell. The junction is formed in a thin surface zone of approximately 0.5 microns on the surface of the silicon substrate. Current is removed from the solar cells by means of a grid of very thin metallic conductors deposited on the surface of the cell. The rear surface of the cell has a metallic coating deposited thereupon. The grid-like structure of the metallic conductors permits maximum light energy to impinge upon the solar cell while still providing a means for conducting current out of the cell.

A great number of techniques for bonding glass to metals are known in the prior art. One technique is disclosed in the Pomerantz U.S. Pat. No. 3,397,278 granted Aug. 13, 1968 and assigned to the P. R. Mallory & Co., Inc. A method of encapsulating a planar surface of a silicon semiconductor device with a glass is disclosed which includes heating an insulator such as glass to a temperature below its fusion point to render the glass electrically conductive. An electrical potential is then applied across the juxtaposed glass insulator element and a semiconductor element. An electric current is passed through the points of contact between the elements and creates an electrostatic field between adjoining surfaces causing the juxtaposed elements to be attracted into intimate contact, progressivly closing the gaps therebetween and forming a bond between the adjoining surfaces.

Bonding of a cover glass to a silicon solar cell is described in an article entitled "Integrally Bonded Covers for Silicon Solar Cells" by Allen R. Kirkpatrick, Proceedings of the Eleventh IEEE Photovolatic Specialists Conference, 1975. The method described therein includes positioning a cover glass upon a solar cell surface, raising the temperature of the combination, and applying an electric field to produce a bonding effect. A temperature in excess of 400° C. is used, which is still well below the softening point of the Corning type 7070 glass. This temperature is adequate to create mobile positive ions in the glass. The electric field moves the mobile positive ions away from points of contact at the glass-cell interfaces producing a shallow region depleted of positive ions. Nearly all of the applied voltage, usually several hundred volts, thus appears across the polarized layer thereby formed. A strong electrostatic force proportional to the square of the electric field acts to close the gaps between the glass-cell interface. Starting from a few points of initial contact the entire cell-glass interface is thereby forced together after several minutes. The metalization pattern, or grid, on the front of the silicon cell surface is accomodated by plastic deformation of the glass at a temperature above the strain point of the glass. Such temperatures tend to produce undesirable thermal degradation of the silicon solar cell material. The electrostatic field itself is said to cause plastic flow deformation of the glass around the metallic conductor grids.

Another prior art method requires heating the cover glass and the silicon cell to a temperature near the strain point temperature of the glass, that is, the temperature at which stresses in the glass are thermally relieved in a matter of hours. Mechanical pressure of approximately 150 pounds per square inch pressure is then applied to force the cover glass material around the conductors. This method has disadvantages, one being that gaps are present between the cover glass and the silicon surface alongside the conductors. Another disadvantage is that high internal stresses are produced in the bonded product near the conductors such that with thermal and mechanical cycling the glass cracks, and tiny cracks occur at the silicon glass interface. In addition, this process is applicable to relatively thick cover glasses and silicon solar cells. Thicknesses of 12 mils are required to withstand the mechanical forces required.

Silicon solar cells are now available which have a thickness of two mils and which are as efficient as the older 12 mil cells. Appropriately thinner cover glasses are also available for use in conjunction with the thinner silicon solar cells. These thinner cells and cover glass combinations are particularly useful for applications such as solar satellite power sources where light weight, efficiency and high mechanical reliability are important design requirements. The prior art glass to silicon bonding techniques are not suitable for bonding thin cover glasses to thin silicon solar cells having a metallic grid deposited thereupon.

Prior art electrostatic techniques using conventional heating steps have not adequately solved the problem of providing stress-free, gap-free integral bonds between solar cells and their cover glasses. These conventional heating steps have not provided enough heat to adequately soften the cover glass material near the conductors on the silicon cells so that high stresses are induced in the finished product. On the other hand, the techniques sometimes provide too much heat to the semiconductor material so that thermal degradation occurs. These problems are particularly evident when the thinner cover glasses and shallow junction solar cells are to be bonded.

SUMMARY OF THE INVENTION

It is an object of the invention to provide a means for continuously bonding by electrostatic means two surfaces, one surface having projections thereupon.

It is also an object of the invention to provide a method for bonding thin cover glasses to thin plates of semiconductor material.

It is another object of this invention to provide a method for forming glass to silicon integral bonds having reduced residual stress in the region of conductors deposited upon the silicon cell.

It is another object of the invention to provide a method for quickly and economically producing an integrally bonded cover glass for silicon solar cells.

It is another object of this invention to provide a method for bonding a glass cover plate element to a semiconductor cell element having metallic conductors deposited thereon which bonding occurs on substantially all of the available surface between the elements.

A preferred method of the invention provides a means of continuously bonding by electrostatic means two surfaces, one a reflective projecting portion. The material adjacent the projection is selectively softened by energy being reflected back by the reflective projecting portion. This allows the projecting portion to be electrostatically drawn into the softened adjacent material to provide a substantially continuous bond between the two surfaces. A method is provided for integrally bonding a cover glass to a semiconductor cell, or substrate, which has metallic conductors deposited on the surface thereof. The method requires knowledge of the radiation absorption characteristics of the cover glass material and the semiconductor cell material as a function of electromagnetic energy wavelength in order to provide a cover glass and a semiconductor cell having a desired ratio of energy absorptions at a certain wavelength. A juxtaposed cover glass and semiconductor cell are heated to a first temperature sufficient to cause ion drift in the cover glass material which establishes an electrostatic field between the juxtaposed cover glass and the silicon cell. A high voltage is also applied between the juxtaposed cover glass and the semiconductor cell for electrostatic bonding. In one preferred method, the absorption characteristics of the cover glass material and the semiconductor cell material used are approximately equal at a given wavelength. Pulsed electromagnetic energy having the given wavelength irradiates the juxtaposed cover glass and semiconductor cell from the cover glass side. A substantially normally directed pulse of electromagnetic energy having the given wavelength and sufficient intensity heats the cover glass and the semiconductor cell to a second temperature. The pulse of electromagnetic energy irradiates the juxtaposed combination of elements such that additional heating occurs in those regions of the cover glass immediately adjacent the metallic conductors on the surface of the semiconductor cell by energy being reflected from the metallic conductor surface back into the glass. The temperature achieved by the additional heating is sufficient to soften the cover glass in the region immediately adjacent the metallic conductors. After the selected regions of the cover glass are softened, electrostatic attraction draws and bonds the inner surfaces of the cover glass and the semiconductor cell providing integral bonding along the interfaces between the elements including those areas adjacent to metallic conductors formed on the surface of the semiconductor cell.

DESCRIPTION OF THE PREFERRED EMBODIMENT

Figure 1:
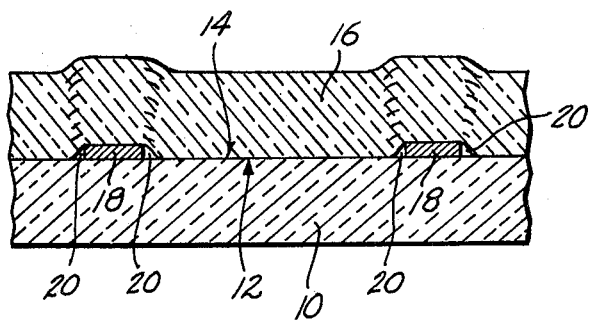
FIG. 1 is a cross-sectional view of a prior art glass and silicon bonded composite.

FIG. 1 of the drawings shows a composite of a cover glass and silicon cell produced according to a prior art bonding method. For example, a relatively thick 12 mil silicon solar cell 10 has bonded to the upper surface 12 thereof the lower surface 14 of a cover glass 16. Using techniques well known in the art, conductor elements 18 are placed on the upper surface 12 of the solar cell array 10 and form part of a grid of interconnected conductors on one side of the silicon solar cell 10. The prior art method of forming a glass and silicon bonded composite such as shown in FIG. 1 is a combination of plastic and elastic deformation method which uses electrostatic force and heat, as well as external pressure. Undesirable gaps (typically shown at 20) alongside the conductor elements 18 result. The prior art method for producing cover glass to silicon cell bonds are required to maintain the temperature of the elements below the strain point temperature of the glass materials typically used. The strain point temperature is the temperature at which stresses in a material are relieved in a matter of hours. Higher temperatures applied to the material for extended periods of time would produce undesirable thermal deterioration of the semiconductor device. Because of the relatively low temperatures used in the prior art processes, the cover glass material does not soften and flow to fill the undesirable gaps 20 near the conductor elements 18 as shown in FIG. 1. In addition, since the silicon and glass bonded composites formed by the combined mechanical and electrostatic forces are formed in the prior art at temperatures below the annealing temperature of the cover glass, areas of high stress are produced in the resultant composites. The stresses tend to promote cracking with consequent poor production yield and poor performance reliability. The stress problem is particularly apparent when very thin, 2 mil thick cover glasses and silicon cell arrays are electrostatically bonded to correspondingly thin cover glasses.

Figure 2:
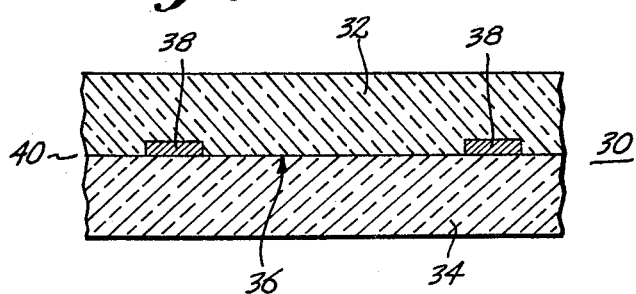
FIG. 2 is a cross-sectional view of a glass and silicon integrally bonded composite formed according to the method of the invention.

Referring to FIG. 2, an electrostatically-bonded glass to silicon composite 30 is formed from a thin glass plate 32, or cover glass, such as Corning type 7070 borosilicate glass which is two mils thick by two centimeters square, and a silicon solar cell 34 which is also two mils thick and two centimeters square. The upper surface 36 of the silicon solar cell 34 has been appropriately doped to produce a pn junction which provides an active region approximately one-half micron thick. A conducting grid of conductors 38 is formed, for example, of silver plated titanium having a thickness of five microns. It is desirable that no gaps greater than one micron be present at the interface 40 formed between the thin glass plate 32 and the silicon solar cell 34. It is further desirable that the spaces alongside the conductors 38 be glass-filled as shown in FIG. 2. This is difficult to accomplish because the melting point of the exemplary glass material exceeds the safe operating temperature of the silicon cell array and conventional heating methods would ruin the semiconductor device. While this embodiment describes a silicon semiconductor cell, other semiconductor materials such as germanium and gallium arsenide may have cover glasses bonded thereto in accordance with the method and principles disclosed herein.

Briefly, FIG. 3 pictorially represents a portion of a cover glass and a silicon solar cell prior to bonding according to the method of the invention, as described below.

Figure 4:
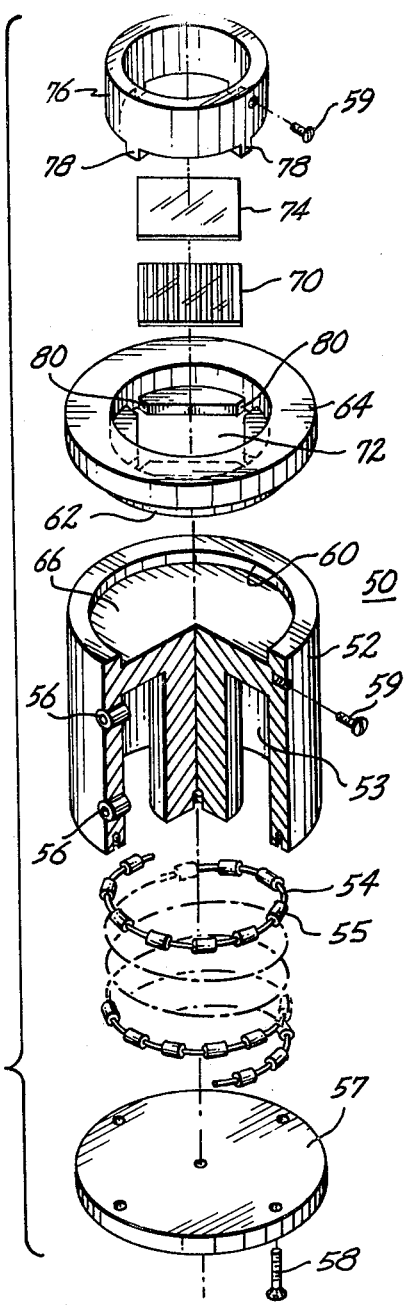
FIG. 4 is an exploded, perspective sectional view of a fixture for practicing the method of the invention.

The method of the invention is accomplished by the apparatus shown in FIG. 4. FIG. 4 shows a fixture 50 which provides a means for juxtaposing a cover glass element over a silicon cell element such that the elements are spaced-apart by the conductors on the silicon cell. The fixture 50, as will be described hereinbelow, provides means for coupling a high voltage supply and a current source to the juxtaposed elements. A heating coil in the fixture 50 preheats the juxtaposed elements to a first temperature somewhat lower than that required for electrostatic bonding. The fixture holds the preheated, juxtaposed elements prior to and during electrostatic bonding so that a short-duration pulse of high energy electromagnetic energy can be applied to the juxtaposed elements. The energy pulse heats both of the juxtaposed elements very quickly, more or less equally as will be seen, to a second temperature exceeding the temperature at which thermal degradation of the silicon cell would normally occur if such a temperature were maintained over a long period of time. Reflection of energy from the conductor back into the cover glass causes localized heating of the cover glass material near the conductor to a third, higher temperature at which actual softening of the cover glass material near the conductor occurs, permitting glass to flow filling any gaps around the conductors.

A detailed description of FIG. 4 follows. The fixture 50 includes a cylindrical copper body 52 which has an annular cavity 53 formed in the lower portion thereof for containing a nichrome wire heating coil 54 for preheating the copper body 52 to, for example, a temperature of 400° C. The heating coil 54 is insulated from the cylindrical body 52 by means of a plurality of ceramic sleeve insulators 55 and the ends of the heating coil 54 are fed through ceramic insulating sleeves 57 located in the outer wall of the cylindrical body 52. A bottom copper plate 57 is fastened to the lower part of the cylindrical body 52 by appropriate fastening means, such as a plurality of screws 58. A connection point for applying voltage and for a thermocouple lead is provided by a terminal 59 attached to the cylindrical body 52. At the top end of the cylindrical body 52 is formed a bore 60 which serves as a receptacle for a mating cylindrical projecting portion 62 of an insulating boron nitride plate 64. The bottom interior face 66 of the receptacle formed by the cylindrical bore 60 forms a smooth surface against which the backside of a silicon cell array 70 is placed. The interior of the cylindrical projecting portion 62 of the insulating plate 64 has formed therein a square-shaped aperture 72 for containing a similarly shaped silicon cell 70 and a cover glass 74. FIG. 4 shows the silicon cell 70 having a conductive grid on its top surface. A copper hold down and bias clamp 76 is formed as a cylindrical sleeve which fits within a chamber bored in the top surface of the insulating plate 64. Four projecting lugs 78 extend downwardly from the clamp 76 such that the ends of the lugs 78 engage slots 80 positioned at the corners of the square-shaped aperture 72 in the locating plate 64. The clamp 76 rests upon the corners of the cover glass and maintains the silicon cell 70 and the cover glass 74 in contact. Another terminal 59 attached to the clamp 76 provides a voltage connection point.

Figure 3:
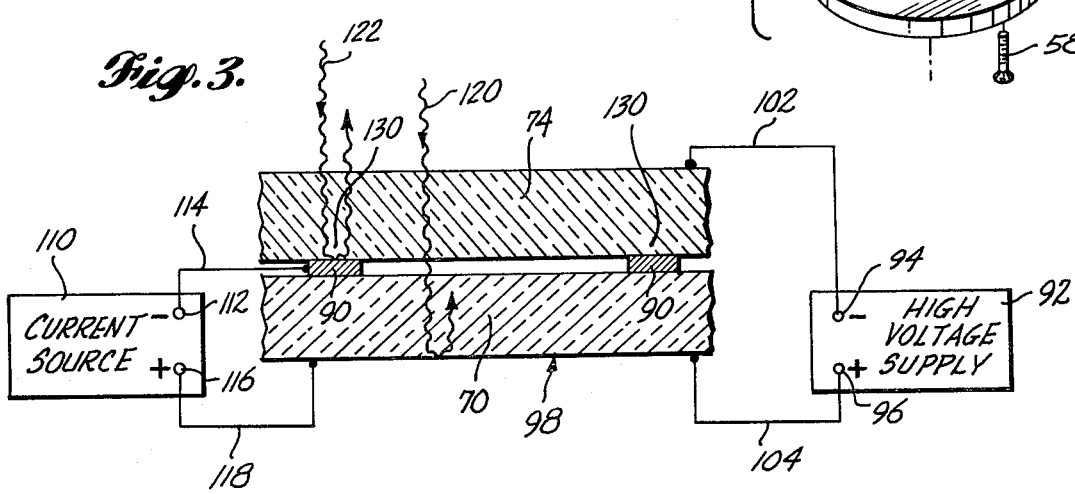
FIG. 3 is a cross-sectional view of juxtaposed elements provided according to the method of the invention.

FIG. 3 pictorially represents a portion of the silicon cell 70 and the cover glass 74 as they are assembled in a juxtaposed relationship in fixture 50. When a suitable source of current (not shown) is applied to the nichrome wire heating coil 54 the temperature of the juxtaposed silicon cell 70 and the cover glass 74 is maintained, for example, at 400° C. Radiant energy from, for example, a laser is directed through the central area of the hold down and bias clamp 76 opening. The energy is substantially normally directed onto the cover glass 74, as will be described hereinbelow. The juxtaposed silicon cell 70 and the cover glass 74 portions are shown in FIG. 3 to be spaced apart by thin conductors 90 forming part of the conductive grid in the face of the silicon cell 70. A high voltage supply 92 is adjustable to produce an output voltage between 200 and 1,000 volts DC. The negative terminal 94 is connected to the upper surface of the cover glass 74 and the positive terminal 96 is connected to the back surfaces 98 of the silicon cell 70 respectively by conductor means 102, 104 representing the electrical connections provided by the various components of the fixture 50 and other appropriate electrical connection means as known in the art.

FIG. 3 diagramatically shows a current source 110 having a negative terminal 112 which is connected by conductor means 114 to the conductors 90 formed on the surface of the silicon cell 70. A positive terminal 116 of the current source 110 is connected to the back surface 98 of the silicon cell 70 by conductor means 118. If it is necessary to adjust the light absorption in the silicon cell 70 to match that of the cover glass plate 74 for a given electromagnetic wavelength of the energy source, the current source 110 is pulsed to provide injection of free carriers into the silicon cell 70. Destructive heating of the silicon cell 70 is avoided by pulsing the current therethrough. The current pulse is timed to coincide with the application of an electromagnetic energy pulse.

A source of electromagnetic energy suitable for practicing the method of the invention is a pulsed HF chemical laser having a beam diameter of approximately four centimeters and capable of a pulsed energy output of up to one million Joules/cm$^2$-seconds. The HF laser emits energy at spectral lines between 2.58 and 3.08 microns with the average power density at approximately 2.75 microns. In FIG. 3 a first energy-ray 120 pictorially illustrates a portion of the energy from an electromagnetic pulse which is substantially normally directed to the outer surface of the cover glass. Some of the energy passes through and is absorbed by the cover glass 74 and the silicon cell 70. Other angles of energy direction with respect to the cover glass are used as required to obtain desired energy absorption. The remaining energy not absorbed passes through the cell and may be reflected from the back surface 98 of the silicon cell 70 or the interior face 66 of the fixture body 52 for subsequent absorption. A second energy ray 122 pictorially represents that portion of the energy from the energy pulse which impinges upon the surface of the conductors 90 and is reflected back through and is absorbed in the cover glass material in the region immediately adjacent or above the conductor 90.

The thermal diffusivity or thermal diffusion time of a material indicates how fast temperature differences in a material equalize. It is desirable to choose the duration of the energy pulse to be greater than the thermal diffusion time of the silicon cell 70 material and shorter than the thermal diffusion time of the cover glass material 74.

In the silicon cell 70 this permits the thermal, or heat, energy produced by the energy pulse to be rapidly conducted through the silicon cell 70 to provide uniform heating throughout. Those portions of the cover glass 74 which contact the silicon cell 70 are also uniformly heated. Uniform heating tends to minimize the formation of thermally-induced stressed regions in the resultant composite structure. It is desirable that the thermal diffusion time of the cover glass material be long compared to the energy pulse duration so that selective softening of the cover glass occurs immediately above the conductors 90 in the regions 130 as shown in FIG. 3. When the glass in the region 130 is softened to the desired degree, electrostatic attraction pulls the silicon cell 70 and the cover glass 74 into integral bonding contact and the conductors 90 are pushed into the soft glass of the cover glass 74 immediately above the conductors 90. This produces a structure as shown in FIG. 2 wherein the conductors 38 are surrounded by glass and a substantially continuous electrostatic bonding of the cover glass to the silicon cell 70 is provided all along the interface therebetween, especially in the vicinity of the conductors 38. A three microsecond energy pulse width was selected as suitable because type 7070 borosilicate glass has a thermal diffusion time of approximately ten microseconds while the silicon solar cell material has a thermal diffusion time of approximately 1/10th of a microsecond.

The method for integrally bonding a thin glass plate, or cover plate, 32 to a silicon cell 34 having metallic conductors 38 formed on the surface thereof includes several steps. One of these requires knowledge or a determination of the radiation absorption characteristics of the cover glass material and of the silicon cell material as a function of electromagnetic energy wavelength which is expressed, for example, as percent transmission. These techniques of measurement are well known in the art. For example, a sample of 1/16th inch thick Corning type 7070 borosilicate glass at 2.75 microns enery wavelength has a relative transmission of 40% and a two mil thick silicon solar cell has a transmission of 40% at wavelengths between 2.5 and 5.0 microns. A 1/16th inch thick sample of fused silica glass known as GE 104 produced by the General Electric Company has a transmission of 40% at approximately 4.25 microns wavelength. Spectral transmission measurements or data provided from appropriate reference sources may be used to determine the energy absorption characteristics of the materials used for cover glass and for the semiconductor solar cells. Other semiconducting material such as germanium and gallium arsenide may be used. The method according to the invention further contemplates selecting an electromagnetic wavelength at which the absorption characteristics of the cover glass material and the silicon cell are approximately equal or in some other desired ratio as required to obtain desired heating of the cover glass and semiconductor cell materials.

After an appropriate wavelength and/or choice of materials is made, the cover glass 74 and the silicon cell 70 such as shown in FIGS. 3 and 4 are juxtaposed in the fixture 50 as described hereinabove. High voltage from a source such as, for example, the high voltage supply 92 is applied between the outer surfaces of the juxtaposed cover glass and the silicon cell array. The juxtaposed elements are pre-heated to a first temperature, for example, 400° C., to cause ion drift in the cover glass material establishing an electrostatic bonding field between the juxtaposed cover glass 74 and the silicon cell 70. Pulsed electromagnetic energy, such as from the HF laser described above, irradiates the juxtaposed cover glass 74 and the silicon cell 70 with a preselected wavelength and at an intensity which heats the cover glass and the silicon cell to a second temperature, for example 600° C. The pulse width of the energy pulse is, for example, three microseconds and is of such a duration that the cover glass and the semiconductor device are not thermally damaged. Energy from the pulsed electromagnetic energy source is reflected by the metallic conductors 90 into the regions 130 immediately above the conductors 90 such that the regions 130 are additionally heated by the reflected energy to a third temperature, for example 800° C., which is sufficient to soften the cover glass material. Electrostatic attraction between the cover glass 74 and the silicon cell 70 then draws and bonds the inner surfaces of the cover glass and silicon cell. The metallic conductors 38 are pushed into the softened regions 130 of the cover glass, thus providing an integral electrostatic bond along the interfaces between the cover glass and the silicon cell including those areas adjacent the metallic conductors 90. FIG. 2 shows a structure provided according to the method of the invention.

The following example is for illustrative purposes and is not intended to limit the scope of the present invention.

EXAMPLE

Cover glass sheet: Corning 7070 borosilicate glass having a thickness of two mils and an area of two centimeters square.
Silicon solar cell: A two mil thick P-type substrate having an n doping with a thickness of 0.5 mils and an area of two centimeters square.
Electrodes: Silver plated titanium having a thickness of one-half micron.
Energy source: HF pulsed chemical laser with a pulse width of three microseconds with approximately 100,000 Joules per second per $cm^2$. The energy output of the laser is adjusted to produce temperatures of approximately 600° C. in the cover glass and the silicon cell and a temperature of approximately 800° C. in the region above the electrodes.

The product produced by the method of the invention produces a cover glass and silicon cell composite which is bonded along substantially all of the interface between the cover glass and the silicon cell.

In summary, integral electrostatic bonding is achieved along the entire adjoining surfaces of a cover glass and a silicon solar cell by preferential heating of selected portions of the cover glass using a pulsed laser. Even though there are metallic conductors on the surface of the silicon solar cell, bonding is achieved by rapid heating and softening of the cover glass in the regions above the conductors using a high-power, pulsed laser energy source. Preferential heating near the conductors is due to energy being reflected back from the conductors into the cover glass. The energy absorption characteristics of the cover glass and the silicon solar cell materials are chosen for approximately equal absorption at a given average pulsed laser wavelength. When pulsed by energy from the laser, the cover glass and silicon solar cell are both equally energized for several microseconds to reach a temperature well above the stress point temperature of the cover glass material and above the thermal degradation temperature of the silicon solar cell material without harmful effects. Prior to irradiation by the high-power laser, a high voltage electrostatic-bonding potential is imposed across the cover glass and the silicon solar cell. The cover glass material and silicon material are also heated to the level at which ion drift occurs in the cover glass material and at which the silicon material becomes more conductive. The glass and the silicon material are thus attracted together by the electrostatic field established between the cover glass and the silicon solar cell. When the cover glass is sufficiently softened by the pulsed laser, the cover glass and the silicon solar cell are electrostatically drawn together and bonded into intimate contact along the interface areas therebetween including those areas immediately adjacent to the conductors.

While particular embodiments of the present invention have been shown and described, it should be understood that the invention is not limited thereto since many modifications to the method provided by this invention may be made. It is therefore contemplated to cover by the present application any and all such modifications that fall within the true spirit and scope of the basic underlying principles disclosed and claimed herein.

I claim:

1. A method of integrally bonding a cover glass to a surface of a semicondutor cell having conductors thereon, comprising the steps of:
providing a semiconductor cell and a cover glass having a desired ratio of energy absorptions at a certain wavelength;
juxtaposing the cover glass and the semiconductor cell, the conductors spacing apart the cover glass and the semiconductor cell;
applying a predetermined electrostatically-bonding high voltage between the outer surfaces of the juxtaposed cover glass and the semiconductor cell;
pre-heating the juxtaposed cover glass and the semiconductor cell to a first temperature sufficient to promote ion drift in the cover glass and to establish an electrostatic field between the cover glass and the cell; and
irradiating the juxtaposed cover glass and the semiconductor cell with a pulsed beam of electromagnetic energy at the certain wavelength on a path substantially normal to said cover glass to heat the juxtaposed cover glass and the silicon cell to a second temperature higher than the first temperature except in those regions above the conductors which are heated to a third temperature higher than the second temperature due to reflection back into said cover glass of the pulsed beam by the conductors, the third temperature sufficient to enable the cover glass to soften and flow around the conductors so that the cover glass is electrostatically drawn toward the adjacent surface of the semiconductor cell to bond the surfaces thereof along substantially all of the interface therebetween.

2. The method of claim 1 wherein the duration of the pulse of electromagnetic energy is longer than the thermal diffusion time of the semiconductor cell and shorter than the thermal diffusion time of the cover glass.

3. The method of claim 1 wherein the energy absorption of the semiconductor cell is controlled by a current source connected thereto.

4. The method of claim 3 wherein the semiconductor cell energy absorption is controlled by a pulse of current coinciding with the pulse of electromagnetic energy.

5. The method of claim 1 wherein the average power density frequency of the pulsed beam is adjusted to provide the desired ratio of energy absorptions.

6. The method of claim 1 wherein the desired ratio is substantially 1:1.

7. The method of claim 1 wherein the cover glass is borosilicate glass.

8. The method of claim 1 wherein the semiconductor cell is a silicon cell.

9. The method of claim 1 wherein the conductor is silver-plated titanium.

10. The method of claim 1 wherein the cover glass is a borosilicate glass, the semiconductor cell is silicon and wherein the first preheat temperature is approximately 400° C., the second temperature is approximately 600° C., and the third temperature is approximately 800° C.

11. The method of claim 1 wherein the semiconductor cell temperature is controlled by passing a current therethrough.

12. A method for bonding a surface of an object of a first partially energy absorbant material to a surface of another object of a second material having an energy reflective projecting portion on the surface thereof comprising:
juxtaposing the surfaces;
preheating and applying an electrostatic potential to the objects to establish an electrostatic bonding field therebetween; and
irradiating the objects with pulsed energy to further heat the objects and to cause even further selective heating and softening of the first material adjacent the projecting portion by reflection of pulsed energy from the energy reflective projecting portions back into the first material whereby the projecting portion is drawn into the softened material and a substantially continuous bond is obtained between the surfaces of the materials including those areas adjacent to the projecting portion.

* * * * *